(12) United States Patent
Suzuki et al.

(10) Patent No.: US 7,651,775 B2
(45) Date of Patent: Jan. 26, 2010

(54) PLASTIC OPTICAL COMPONENTS, OPTICAL UNIT USING THE SAME AND METHOD OF FORMING INORGANIC MOISTURE-PROOF COATING ON PLASTIC OPTICAL COMPONENTS

(75) Inventors: Fumiyuki Suzuki, Tokyo (JP); Noriko Eiha, Kanagawa (JP); Hideaki Naruse, Kanagawa (JP); Hiroshi Iwanaga, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 455 days.

(21) Appl. No.: 11/517,331

(22) Filed: Sep. 8, 2006

(65) Prior Publication Data

US 2007/0057230 A1 Mar. 15, 2007

(30) Foreign Application Priority Data

Sep. 9, 2005 (JP) ............................. 2005-262736

(51) Int. Cl.
*B32B 9/00* (2006.01)
*C23C 16/00* (2006.01)
(52) U.S. Cl. ........................ 428/446; 428/448; 428/689; 428/702; 428/336; 427/248.1; 427/255.18
(58) Field of Classification Search ........................ None
See application file for complete search history.

(56) References Cited

U.S. PATENT DOCUMENTS 5,506,718 A 4/1996 Takahashi

2004/0247901 A1 12/2004 Suzuki et al.
2006/0056036 A1* 3/2006 Suzuki et al. ............... 359/642

FOREIGN PATENT DOCUMENTS

| JP | 6-43375 A | | 2/1994 |
| JP | 7-58103 A | | 3/1995 |
| JP | 11-231127 | * | 8/1999 |
| JP | 2004-361732 A | | 12/2004 |

OTHER PUBLICATIONS

Translation of JP-11-231127.*

* cited by examiner

*Primary Examiner*—Ling Xu
(74) *Attorney, Agent, or Firm*—Sughrue Mion, PLLC (57) ABSTRACT

There are provided plastic optical components which, in addition to their superior characteristics such as lightweightness, low cost and suitability for mass production, exhibit superior moisture barrier properties while experiencing extremely small changes in refractive index or other optical performance even if they are subjected to the effect of water in the environment; and an optical unit using such plastic optical components. The plastic optical component includes an optical component's body and an inorganic moisture-proof coating which is directly or indirectly formed by a plasma CVD process at least on surfaces of the optical component's body that contact outside air, and the plastic optical component is kept at a temperature of 80° C. or lower when the inorganic moisture-proof coating is formed by the plasma CVD process.

18 Claims, 2 Drawing Sheets

PLASTIC OPTICAL COMPONENTS, OPTICAL UNIT USING THE SAME AND METHOD OF FORMING INORGANIC MOISTURE-PROOF COATING ON PLASTIC OPTICAL COMPONENTS

The entire contents of documents cited in this specification are incorporated herein by reference.

FIELD OF THE INVENTION

The present invention relates to the technical field of optical components such as lenses and prisms that are made of plastics and optical units using the same. More particularly, the present invention relates to plastic optical components that experience extremely small changes in optical performance due to moisture absorption, and an optical unit using such plastic optical components.

The invention also relates to a method of forming an inorganic moisture-proof coating on such plastic optical components.

Conventionally, camera lenses and a variety of lenses used in finders, copy equipment, printers, projectors and optical communications, as well as optical components including prisms, spectacle lenses, contact lenses and magnifiers are mostly manufactured from glass.

However, with the recent progress in plastic materials and in the plastics molding technology, it has become possible to manufacture lenses, prisms and other optical components at low cost using plastics which are made from cheap materials, and are lightweight and suitable for mass production.

The problem with such plastic optical components is that the environmental humidity adversely affects their optical performance parameters such as refractive index, so glass lenses such as lenses in high-end SLR cameras are still employed in uses that require high precision (i.e., high resolution).

With a view to solving this problem, attempts have been made to develop plastic materials having high moisture resistance, namely, low hygroscopicity by various approaches such as designing special polymer structures. However, the cost of such attempts is so high as to sacrifice the economical advantage of plastics themselves.

An attempt has been made to cover the surface of a plastic optical component such as a lens with an inorganic or organic moisture-proof coating in order to reduce the influence of the environmental humidity (see JP 6-43375 A and JP 2004-361732 A).

JP 2004-361732 A describes that dry film deposition processes such as vacuum deposition, sputtering, ion plating and CVD processes, and various wet film deposition processes such as a sol-gel process can be used for the method of forming the inorganic coating, and that various wet film deposition processes such as a solution coating process and various dry film deposition processes such as plasma polymerization and CVD processes can be used for the method of forming the organic coating.

However, when an organic coating was formed using a wet film deposition process such as the solution coating process, it was difficult to make the coating uniform in thickness, and one had difficulty in obtaining a highly uniform coating that could be used in optical applications. Further, when an inorganic coating was formed using a wet film deposition process such as the sol-gel process, the resulting coating was low in compactness and could not have desired moisture barrier properties.

On the other hand, when an inorganic coating was formed using a dry film deposition process such as the vacuum deposition or sputtering, the resulting film could be high in density and excellent in moisture barrier properties. However, the inorganic coating formed by the vacuum deposition or sputtering was low in durability to cause cracking, leading to performance degradation and thus could not exhibit excellent moisture barrier properties in a consistent manner.

JP 7-58103 A describes that owing to its remarkable properties such as excellent moisture resistance, a silicon nitride ($Si_3N_4$) film is widely used for the plastic surface coating, and that the coating with $Si_3N_4$ is carried out mainly by a plasma CVD process.

It is also described that a member made of, for example, a plastic whose properties change upon heating to a high temperature cannot be coated by conventional plasma CVD processes which require heating of a member to be coated to about 300° C., whereas the method described in this document allows a member to be coated with silicon nitride or silicon oxide without heating the member and is hence particularly appropriate for coating optical components such as lenses and prisms.

SUMMARY OF THE INVENTION

The inventors of the present invention have found that, when a plasma CVD process as that described in JP 7-58103 A is used to form an inorganic moisture-proof coating, the optical characteristics of the resulting plastic optical component deteriorate.

JP 7-58103 A describes that the method described in this document allows a member to be coated with silicon nitride or silicon oxide without heating it, but the member to be coated is in close proximity to the electrodes and hence the method described in this document does not enable the surface coating of a member, that is, a plastic without heating. More specifically, FIG. 1 of this document shows a plasma CVD device of a capacitively coupled plasma excitation type in which a member to be coated 21 lies directly on a lower electrode 13 to which a high-frequency voltage from a high-frequency power source 15 is applied (these reference numerals are used in the cited document). When subjected to plastic surface coating in this state, a plastic optical component to be coated is heated to 100° C. or higher.

The plasma CVD device shown in FIG. 1 is appropriate to the surface coating of an object whose surface to be coated is flat, as exemplified by a compact disk or an optical disk, but in order to uniformly form an inorganic moisture-proof coating on the entire outer surface of an object (e.g., a camera lens) whose surface to be coated has a complicated shape, the device must be stopped many times to change the orientation of the object, which causes the problems including decrease in the production efficiency, waste of raw materials and decrease in the energetic efficiency. FIG. 8 of this document shows a continuous processing type plasma CVD device, which is intended for use in magnetic tapes and other plastic films and is not appropriate for the optical components such as lenses and prisms.

The inventors of the present invention have found that, when a plastic optical component is heated to about 100° C., the optical characteristics decrease due to its deformation and the inorganic moisture-proof coating formed readily peels off due to the residual thermal stress.

Deterioration of the optical characteristics due to the deformation of the plastic optical component becomes a matter of concern particularly in the case where the plastic optical component requires excellent optical characteristics. More specifically, deterioration of the optical characteristics becomes a matter of concern particularly in the case where the plastic optical component used is a high-resolution lens and in particular a lens that has a resolving power in terms of the spatial frequency (MTF) of at least about 150 lines/mm and preferably at least about 200/mm when the contrast is 20%.

Peeling of the inorganic moisture-proof coating is another matter of concern, because such peeling deteriorates the moisture barrier properties of the plastic optical component and is a source of pollution of the plastic optical component and the periphery of the portion where this component is used.

The present invention has been made on the basis of these findings. An object of the present invention is to provide plastic optical components which, in addition to the superior characteristics of the plastic optical components per se such as lightweightness, low cost and suitability for mass production, exhibit superior moisture barrier properties while experiencing extremely small changes in refractive index or other optical performance even if they are subjected to the effect of water in the environment; and an optical unit using the plastic optical components.

Another object of the present invention is to provide plastic optical components which have a moisture-proof coating formed using a plasma CVD process and whose optical characteristics are prevented from being deteriorated by forming the moisture-proof coating, and an optical unit using the plastic optical components.

Still another object of the present invention is to provide a method of uniformly forming an inorganic moisture-proof coating on the plastic optical components with a high degree of efficiency.

In order to achieve the above objects, the present invention provides a plastic optical component comprising:

an optical component's body; and an inorganic moisture-proof coating which is directly or indirectly formed by a plasma CVD process at least on surfaces of the optical component's body that contact outside air, wherein the plastic optical component is kept at a temperature of 80° C. or lower when the inorganic moisture-proof coating is formed by the plasma CVD process. Such plastic optical component is hereinafter referred to as the plastic optical component of the invention.

In the plastic optical component of the invention, the plasma CVD process is preferably of an inductively coupled plasma excitation type.

In the plastic optical component of the invention, the inorganic moisture-proof coating has preferably a composition represented by $SiOxNy$ where $0 \leq x \leq 2$, $0 < y \leq 1.33$ and $2x+3y \leq 4$.

In the plastic optical component of the invention, the inorganic moisture-proof coating has preferably a composition represented by $SiOx_1Ny_1$ where $0.3 \leq x_1 \leq 1.4$, $0.4 \leq y_1 \leq 0.9$ and $2x_1+3y_1 \leq 4$.

In the plastic optical component of the invention, the inorganic moisture-proof coating has preferably a thickness in a range of 10 to 200 nm.

In the plastic optical component of the invention, the inorganic moisture-proof coating is preferably of a structure in which two or more inorganic compound layers whose compositions are different from each other and are represented by $SiOx_0Ny_0$ where $0 \leq x_0 \leq 2$, $0 \leq y_0 \leq 1.33$ and $2x_0+3y_0 \leq 4$ provided that $y_0=0$ in an outermost layer of the two or more inorganic compound layers that contacts the outside air and $y_0 \neq 0$ in its innermost layer that contacts the plastic optical component, are laminated onto the optical component's body.

The innermost layer of the two or more inorganic compound layers that contacts the plastic optical component has preferably a composition represented by $SiOx_1Ny_1$ where $0.3 \leq x_1 \leq 1.4$, $0.4 \leq y_1 \leq 0.9$ and $2x_1+3y_1 \leq 4$.

It is preferable that the two or more inorganic compound layers have a total thickness of 10 to 200 nm and that the outermost layer of the two or more inorganic compound layers that contacts the outside air have a thickness of 10 to 100 nm.

In the plastic optical component of the invention, preferably, the inorganic moisture-proof coating has a composition represented by $SiOx_0'Ny_0'$ where $0 \leq x_0' \leq 2$, $0 \leq y_0' \leq 1.33$ and $2x_0'+3y_0' \leq 4$ provided that $y_0'=0$ in proximity to outside air-contacting surfaces and $y_0' \neq 0$ in proximity to surfaces at which the inorganic moisture-proof coating contacts the plastic optical component, and the inorganic moisture-proof coating is a gradient composition coating whose composition continuously changes along a thickness direction of the inorganic moisture-proof coating.

The inorganic moisture-proof coating has preferably a thickness of 10 to 200 nm and in a portion satisfying $y_0'=0$, a thickness of 10 to 100 nm.

In the plastic optical component of the invention, a material constituting the plastic optical component has preferably a saturated water absorbency in excess of 0.01 wt %.

The plastic optical component of the invention is preferably a lens.

The plastic optical component of the invention is preferably a prism.

The present invention also provides an optical unit comprising at least two lenses having different Abbe numbers, wherein at least one of the lenses is the plastic optical component of the invention. Such optical unit is hereinafter referred to as the optical unit of the invention.

Preferably, the optical unit comprises a lens having an Abbe number of 45-60 and a lens having an Abbe number of 23-35, and the lens having an Abbe number of 23-35 is the plastic optical component of the invention.

Preferably, the lens having an Abbe number of 45-60 is made of glass or alicyclic polyolefins, and the lens having an Abbe number of 23-35 is made of at least one plastic material selected from the group consisting of methacrylic resins, acrylic resins including alicyclic ones, polycarbonate resins, polyester resins including aromatic ones, polystyrene resins, acrylonitrile-styrene resins, alicyclic polyolefins, resins containing the tricyclodecane ring, cycloolefinic polymers, poly (methylpentene), styrene-butadiene copolymers, and polyesters having a fluorene group.

The optical unit of the invention preferably has an autofocus mechanism.

The present invention further provides a method of forming an inorganic moisture-proof coating on a plastic optical component using a plasma CVD process, comprising the steps of:

fixing the plastic optical component onto a holder that can rotate or roll; and forming the inorganic moisture-proof coating on the plastic optical component by the plasma CVD process while the plastic optical component is kept at a temperature of 80° C. or lower. The method described above is hereafter referred to as the method of forming the moisture-proof coating according to the invention.

In the method of forming the moisture-proof coating according to the invention, the plasma CVD process is preferably of an inductively coupled plasma excitation type.

According to the present invention, there is offered the advantage of easily realizing and providing plastic optical components which retain the superior characteristics of plastic optical components per se such as lightweightness, low cost and productivity and which still exhibit superior moisture barrier properties while experiencing extremely small changes in resolution or other optical performance even if they are subjected to the effect of water in the environment. The present invention also has the effect of uniformly forming an inorganic moisture-proof coating having excellent moisture barrier properties on the plastic optical components with a high degree of efficiency.

Although the plastic optical components of the present invention have the moisture-proof coatings formed by using the plasma CVD process, there is no deterioration in the optical characteristics due to the formation of the moisture-proof coating. Therefore, these can be used for the optical components such as a high-resolution lens that require excellent optical characteristics.

As the optical unit of the present invention uses the plastic optical components of the present invention, even in the case of an environmental change, more specifically a change in the environmental humidity, there will occur no uneven refractive index profile in the interior of the lens and, in addition, the lens itself will only undergo a gradual and uniform change in refractive index. In the case where the lens itself undergoes a uniform change in refractive index and if the change is very small, no greater than what occurs due to moisture absorption, a substantial effect on the optical performance of the lens is no more than a change in its focal position and can be cancelled by using an autofocus mechanism.

Therefore, according to the present invention, one can produce a superior optical unit whose optical characteristics will not be influenced by environmental changes.

The method of forming the moisture-proof coating according to the present invention has the effect of uniformly forming an inorganic moisture-proof coating having excellent moisture barrier properties on the plastic optical components with a high degree of efficiency. The moisture-proof coating formed by the inventive method is highly uniform and hence does not adversely affect the optical characteristics and other characteristics of the plastic optical components. Because of its excellent adhesion to the plastic optical components, the moisture-proof coating does not easily peel off the plastic optical components, whereby there is no pollution of the plastic optical components and their surrounding areas, or deterioration of their moisture barrier properties.

DESCRIPTION OF THE PREFERRED EMBODIMENTS

The plastic optical components, the optical unit using the same, and the method of forming the inorganic moisture-proof coating on the plastic optical components according to the invention are described below in detail with reference to the preferred embodiments shown in the accompanying drawings.

Figure 1A:
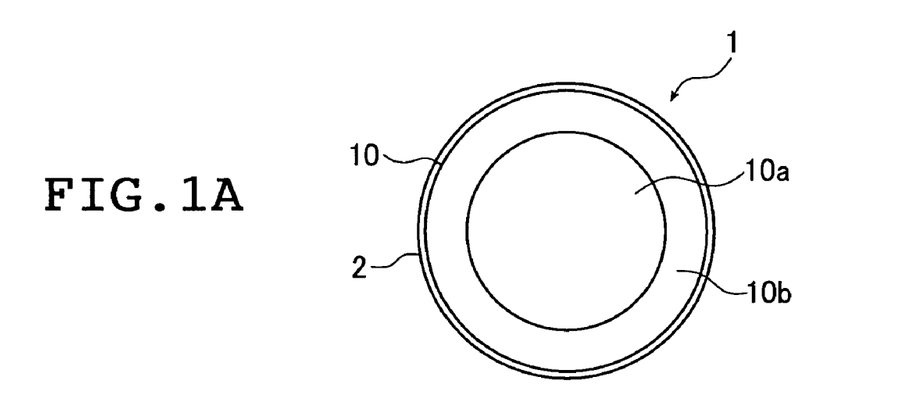
FIG. 1A is a front view showing in concept an embodiment of a plastic optical component of the invention in the form of a lens (as it is seen in a direction parallel to the optical axis)
Figure 1B:
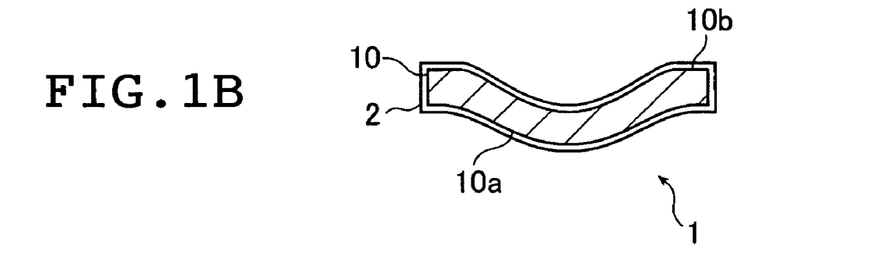
FIG. 1B is a section of the optical component as cut through a plane including the optical axis.

FIGS. 1A and 1B show in concept an embodiment of a plastic optical component of the invention in the form of a lens. FIG. 1A is a front view of the optical component (as it is seen in a direction parallel to the optical axis) and FIG. 1B is a section of the optical component as cut through a plane including the optical axis.

As shown in FIGS. 1A and 1B, an optical component 1 of the invention includes its plastic body (in this case, a lens) 10 and an inorganic moisture-proof coating 2 that is directly or indirectly formed at least on the surfaces of the body 10 which are in contact with the outside air.

The expression "an inorganic moisture-proof coating that is formed at least on the surfaces of the body which are in contact with the outside air" as used herein means that an inorganic moisture-proof coating is formed on the surfaces of the body which are in contact with the outside air (hereinafter these surfaces are referred to simply as "outside air-contacting surfaces") when the optical component is in use. Therefore, the moisture-proof coating is not necessarily formed on all of the external surfaces of the optical component's body. Alternatively, in the case where various coatings such as a coating for adjusting the refractive index, an antireflection coating and a coating for enhancing the adhesion are formed on the outside air-contacting surfaces of the body of the optical component which is in use, the inorganic moisture-proof coating may be formed on these coatings. This corresponds to the case where the inorganic moisture-proof coating is indirectly formed on the outside air-contacting surfaces of the optical component's body.

The optical component 1 shown in FIGS. 1A and 1B has the inorganic moisture-proof coating 2 formed on all the surfaces of its body 10.

Hereinafter, the "body of the optical component" or the "optical component's body" shall refer to a wide range of known optical components including lenses and the "optical component" shall refer to that body of the optical component which has an inorganic moisture-proof coating formed at least on its outside air-contacting surfaces.

The optical component's body 10 shown in FIGS. 1A and 1B assumes the shape of a common plastic lens and includes a lens portion 10a having an optical surface and a flange portion 10b surrounding the lens portion 10a. The optical component 1 shown in FIGS. 1A and 1B has the inorganic moisture-proof coating 2 formed on all the surfaces of the optical component's body 10 including the lens portion 10a and the flange portion 10b.

The inorganic moisture-proof coating 2 is characterized by being formed using a plasma CVD process while the body 10 of the plastic optical component is kept at a temperature of 80° C. or less.

The inorganic moisture-proof coating 2 formed by the plasma CVD process is more excellent in the moisture barrier properties and durability and is more highly dense than inorganic moisture-proof coatings formed by other dry film deposition processes such as sputtering and vacuum deposition.

However, when a conventional plasma CVD process is used, the plastic optical component's body 10 is heated to 100° C. or higher during the formation of the inorganic moisture-proof coating 2, which may deteriorate the optical characteristics of the optical component's body 10. For example, when the optical component's body 10 is a lens, the resolving power or other optical characteristics may be deteriorated and when it is a prism, image distortion may arise.

In the case of the plastic optical component 1 of the present invention, when the inorganic moisture-proof coating 2 is formed by the plasma CVD process, the plastic optical component's body 10 is kept at a temperature of not more than 80° C., which prevents its thermal deformation. The residual thermal stress of the inorganic moisture-proof coating 2 formed is reduced to improve the coating durability. As a result, the optical characteristics of the plastic optical component's body 10 are prevented from being deteriorated although the inorganic moisture-proof coating 2 is formed by the plasma CVD process.

The plasma CVD excitation system for use in forming a thin film such as the inorganic moisture-proof coating is classified into a high-frequency discharge type and a microwave discharge type. The high-frequency discharge type is further classified into a capacitively coupled plasma excitation type and an inductively coupled plasma excitation type. On the other hand, a microwave induced plasma type in which a microwave is directly introduced to excite plasma and an ECR (electron cyclotron resonance) plasma excitation type in which plasma is excited at a high frequency under the action of the magnetic field are mainly used as the microwave discharge type.

Of these, it is preferable to use the plasma CVD process of the inductive coupling type. In the plasma CVD process of the inductive coupling type, the position at which plasma generates is more spaced apart from the position on the holder at which a member to be treated is fixed than in other plasma CVD processes, hence the temperature of the member to be treated does not increase so much during the film deposition. Therefore, this process is appropriate for forming the inorganic moisture-proof coating 2 while the plastic optical component's body 10 is kept at 80° C. or lower. However, other plasma CVD processes than the capacitively coupled plasma excitation type in which a member to be treated (plastic optical component's body 10) is provided in close proximity to the lower electrode and hence is directly exposed to high-temperature plasma can be applied to the present invention as long as the positional relationship between the position at which plasma generates and the position at which the holder is disposed can be selected to form the inorganic moisture-proof coating 2 while the plastic optical component's body 10 is kept at 80° C. or lower.

In order to form the inorganic moisture-proof coating 2 while the plastic optical component's body 10 is kept at 80° C. or lower, the holder for fixing the plastic optical component's body 10 need only be attached at the position satisfying the conditions described below when the inorganic moisture-proof coating 2 is formed by the plasma CVD process:

1. the inorganic moisture-proof coating 2 can be formed on the outside air-contacting surfaces of the plastic optical component's body fixed to the holder; and
2. the temperature of the plastic optical component's body 10 does not exceed 80° C. during the formation of the inorganic moisture-proof coating 2.

The plastic optical component's body 10 may be cooled to keep it at 80° C. or lower. As an exemplary method of cooling the optical component's body 10, a cooling medium such as cooling water or air may be allowed to flow within the holder onto which the optical component's body 10 is fixed to cool the holder so that the optical component's body 10 is indirectly cooled. Alternatively, the optical component's body 10 may be directly cooled by allowing an inert gas such as helium to flow on the back side of the optical component's body 10.

It is preferable to form the inorganic moisture-proof coating 2 as uniformly as possible at least on the outside air-contacting surfaces of the plastic optical component's body 10. To this end, when the inorganic moisture-proof coating 2 is formed by the plasma CVD process, the plastic optical component's body 10 is fixed onto the holder that can rotate or roll so that the surfaces on which the inorganic moisture-proof coating 2 is to be formed (at least the outside air-contacting surfaces) is exposed to plasma as uniformly as possible.

When the plastic optical component's body 10 is fixed onto the holder that can rotate or roll, the portion of the plastic optical component's body 10 that is to be exposed to plasma is preferably increased as much as possible by minimizing the contact area between the plastic optical component's body 10 and the holder. Therefore, the plastic optical component's body 10 is preferably fixed onto the holder with a sharp-pointed pin such as a needle. Use of such pins enables the plastic optical component's body 10 to be stably fixed onto the holder. By rotating or rolling the holder, the surfaces of the plastic optical component's body 10 on which the inorganic moisture-proof coating 2 is to be formed (at least the outside air-contacting surfaces) are uniformly exposed to plasma. In addition, the holder is preferably rotated or rolled so as to make planetary rotation including the rotation on its axis.

The speed at which the holder rotates or rolls is selected as appropriate as long as the speed is not extremely low. However, a speed of about 0.001 to 10,000 rpm is preferable. When the inorganic moisture-proof coating 2 is formed, the speed at which the holder rotates or rolls may be changed within the above range.

As to the procedure for forming the inorganic moisture-proof coating by the plasma CVD process, reference can be made to any known documents, and for example to the following documents:

(1) Journal of Vacuum Science & Technology A: Vacuum, Surfaces, and Films, November, 1998, Volume 16, Issue 6, pp. 3190-3198; and
(2) JP 2005-64167 A.

In the present invention, it is preferable for the inorganic moisture-proof coating formed by the plasma CVD process to have the densest possible structure and not to absorb much light at the target wavelengths.

Therefore, the inorganic moisture-proof coating preferably has a composition represented by $SiO_xN_y$ ($0 \leq x \leq 2$, $0 < y \leq 1.33$, $2x+3y \leq 4$). The "inorganic moisture-proof coating having a composition represented by $SiO_xN_y$ ($0 \leq x \leq 2$, $0 < y \leq 1.33$, $2x+3y \leq 4$)" as used herein refers to the one which contains at least one of a silicon oxide, a silicon nitride and a silicon oxynitride and whose composition is represented by $SiO_xN_y$ ($0 \leq x \leq 2$, $0 < y \leq 1.33$, $2x+3y \leq 4$) as a whole.

The inorganic moisture-proof coating composed of an inorganic compound represented by $SiO_xN_y$ refers to an inorganic moisture-proof coating of a monolayer structure. The composition of the inorganic moisture-proof coating may be the same in all the portions of the coating, in other words, both the symbols x and y of $SiO_xN_y$ may take the same values. Alternatively, the coating may include portions whose $SiO_xN_y$ composition is different, in other words, portions having different x and y values. However, the whole of the inorganic moisture-proof coating preferably has substantially the same composition, because it is formed by the plasma CVD process.

The composition of the inorganic moisture-proof coating is not limited in any particular way as long as SiOxNy ($0 \leq x \leq 2$, $0 < y \leq 1.33$, $2x+3y \leq 4$) is satisfied. However, attention is to be paid to the reduction of the light transmittance due to surface reflection because the inorganic moisture-proof coating is formed at least on the outside air-contacting surfaces of the optical component's body. At a high nitrogen content, the inorganic moisture-proof coating has a high refractive index. In particular, the inorganic moisture-proof coating composed of a silicon nitride represented by $Si_3N_4$ is known to have a refractive index exceeding 3. In the case where the optical component's body and more specifically its optical surfaces are coated with the inorganic moisture-proof coating having such a high refractive index, surface reflection reduces the light transmittance of the optical component's body. Therefore, the symbol $x_1$ in the composition $SiOx_1Ny_1$ of the inorganic moisture-proof coating preferably does not take 0 in order to prevent the light transmittance of the optical component's body from being reduced due to surface reflection.

In consideration of the moisture barrier properties, the inorganic moisture-proof coating has preferably a composition represented by $SiOx_1Ny_1$ ($0.3 \leq x_1 \leq 1.4$, $0.4 \leq y_1 \leq 0.9$, $2x_1+3y_1 \leq 4$) and more preferably by $SiOx_2Ny_2$ ($0.6 \leq x_2 \leq 1.3$, $1.5 \leq y_2 \leq 0.75$, $2x_2+3y_2 \leq 4$).

There is no particular limitation on the thickness of the inorganic moisture-proof coating 2, but the inorganic moisture-proof coating 2 has preferably a thickness of 10 to 200 nm. When the inorganic moisture-proof coating 2 has a thickness of less than 10 nm, desired moisture barrier properties may not be obtained due to occurrence of pinholes. At thicknesses smaller than 10 nm, the thickness of the coating may be uneven. The thickness of the inorganic moisture-proof coating 2 is preferably at least 30 nm and more preferably at least 100 nm.

On the other hand, when the thickness of the inorganic moisture-proof coating 2 exceeds 200 nm, the moisture-proof coating makes no further contribution to the purpose of moisture prevention; on the contrary, a larger thickness requires more time for film formation and hence will lower the production rate. Further, at a thickness of 200 nm or more, residual stress caused in the inorganic moisture-proof coating 2 will increase the chance of cracking.

The inorganic moisture-proof coating of the monolayer structure has been described above, but the inorganic moisture-proof coating formed at least on the outside air-contacting surfaces of the body in the plastic optical component of the present invention is not limited to the one of the monolayer structure.

The inorganic moisture-proof coating 2 formed at least on the outside air-contacting surfaces of the body 10 of the plastic optical component 1 of the present invention may be of a structure in which two or more inorganic compound layers whose compositions are different from each other are laminated onto the body 10 provided that the respective compositions of the two or more inorganic compound layers are represented by $SiOx_0Ny_0$ ($0 \leq x_0 \leq 2$, $0 \leq y_0 \leq 1.33$, $2x_0+3y_0 \leq 4$). The inorganic compound layer as used herein may be the same as the inorganic moisture-proof coating having the composition represented by SiOxNy but in addition to this, $y_0$ may take 0, in other words, the inorganic compound layer may be only composed of a silicon oxide.

As described above, at a high nitrogen content, the inorganic moisture-proof coating have a high refractive index. If the outermost layer on the outside air-contacting surface side of the inorganic moisture-proof coating having a structure in which two or more inorganic compound layers are laminated has a high refractive index, surface reflection causes a decrease in the light transmittance.

On the other hand, the inorganic compound layer only composed of a silicon oxide has a refractive index of as low as not more than 1.5 and the reduction of the light transmittance due to surface reflection is negligible. Therefore, in the case of the inorganic moisture-proof coating having a structure in which two or more inorganic compound layers are laminated, the outermost layer on the outside air-contacting surface side is preferably composed of only a silicon oxide, in other words, $y_0$ in the composition $SiOx_0Ny_0$ of the inorganic compound layer preferably takes 0.

In consideration of the moisture barrier properties, the inorganic compound layer located further inside and particularly the innermost layer that contacts the plastic optical component's body 10 preferably has a composition including nitrogen, in other words, $y_0$ in the composition $SiOx_0Ny_0$ of the inorganic compound layer preferably does not take 0.

Also in consideration of the moisture barrier properties, the innermost layer that contacts the plastic optical component's body 10 preferably has a composition represented by $SiOx_1Ny_1$ ($0.3 \leq x_1 \leq 1.4$, $0.4 \leq y_1 \leq 0.9$, $2x_1+3y_1 \leq 4$).

In the case where the inorganic moisture-proof coating has a structure in which three or more inorganic compound layers are laminated, the same goes for the composition of the outermost layer on the outside air-contacting surface side and the composition of the innermost layer that contacts the plastic optical component's body 10.

As to more than one inorganic compound layer located between the innermost layer and the outermost layer (hereinafter referred to as an "intermediate layer"), its composition is not particularly limited as long as the composition is represented by $SiOx_0Ny_0$ ($0 \leq x_0 \leq 2$, $0 \leq y_0 \leq 1.33$, $2x_0+3y_0 \leq 4$). However, $y_0$ in the composition $SiOx_0Ny_0$ of the intermediate layer preferably does not take 0 in consideration of the moisture barrier properties.

The oxygen and nitrogen contents in the intermediate layer can be selected as appropriate depending on the properties required for the inorganic moisture-proof coating. For example, when weight is given to the moisture barrier properties, the nitrogen content is increased. On the other hand, when weight is given to the prevention of the reduction of the light transmittance due to surface reflection, the oxygen content is increased.

In the case where two or more inorganic compound layers are laminated for the intermediate layer, it is also possible to further enhance the moisture barrier properties while preventing the light transmittance from being reduced due to surface reflection by alternately laminating at least one inorganic compound layer having a high nitrogen content and at least one inorganic compound layer having a high oxygen content.

In the case where the inorganic moisture-proof coating has a structure in which two or more inorganic compound layers are laminated, the total thickness of the inorganic compound layers is preferably in a range of 10 to 200 nm. In the case where the outermost layer on the outside air-contacting surface side is only composed of a silicon oxide, the thickness of the outermost layer is preferably in a range of 10 to 100 nm. When the thickness of the outermost layer falls within the above range, the inorganic moisture-proof coating has the advantageous effect of preventing the light transmittance from being reduced due to surface reflection.

The inorganic moisture-proof coating 2 formed at least on the outside air-contacting surfaces of the body 10 of the plastic optical component 1 of the present invention may be a gradient composition coating whose composition continuously changes along the thickness direction of the coating 2 provided that the composition of the inorganic moisture-proof coating 2 in all the portions satisfies $SiOx_0'Ny_0'$ ($0 \leq x_0' \leq 2$, $0 \leq y_0' \leq 1.33$, $2x_0'+3y_0' \leq 4$).

The expression "composition continuously changes along the thickness direction of the coating 2" as used herein means that the oxygen and nitrogen contents in the coating 2 continuously change along the thickness direction.

The gradient composition coatings in the following two embodiments are possible.

|  | Outside air-contacting surface side | Surface side of plastic optical component's body |
|---|---|---|
| Embodiment 1 |  |  |
| Oxygen content | High | Low |
| Nitrogen content | Low | High |
| Embodiment 2 |  |  |
| Oxygen content | Low | High |
| Nitrogen content | High | Low |

The gradient composition coating in Embodiment 1 is preferably used to prevent the light transmittance from being reduced due to surface reflection. Therefore, when the inorganic moisture-proof coating 2 is a gradient composition coating, it is preferable for the coating 2 to have the composition represented by $SiOx_0'Ny_0'$ ($0 \leq x_0' \leq 2$, $0 \leq y_0' \leq 1.33$, $2x_0'+3y_0' \leq 4$) and for the composition to continuously change along the thickness direction of the coating 2 so that the following conditions (1) and (2) are satisfied:

(1) $y_0'=0$ on the peripheries of the outside air-contacting surfaces; and
(2) $y_0' \neq 0$ on the peripheries of the surfaces at which the coating contacts the plastic optical component's body.

In this case, the inorganic moisture-proof coating 2 is only composed of a silicon oxide on the peripheries of the outside air-contacting surfaces. On the other hand, the peripheries of the surfaces at which the coating 2 contacts the plastic optical component have a composition of a high nitrogen content. Such a gradient composition coating can further enhance the moisture barrier properties while preventing the light transmittance from being reduced due to surface reflection.

When the inorganic moisture-proof coating 2 is a gradient composition coating, there is no particular limitation as to how the oxygen and nitrogen contents vary along the thickness direction of the coating 2. Therefore, the oxygen and nitrogen contents may vary along the thickness direction of the coating 2 linearly, exponentially or logarithmically. In addition, the inorganic moisture-proof coating 2 may have a portion where the composition is identical in its thickness direction.

When the inorganic moisture-proof coating 2 is a gradient composition coating, the portion of the inorganic moisture-proof coating 2 which is on the periphery of the outside air-contacting surface and is only composed of a silicon oxide preferably has a thickness of 10 nm to 100 nm in order to prevent the light transmittance from being reduced due to surface reflection. The total thickness of the inorganic moisture-proof coating 2 is preferably in a range of 10 to 200 nm.

The gradient composition coating having the structure as described above is formed by the following method: The plasma CVD process is carried out using a mixed gas of $SiH_4$ and $N_2$ for the starting material gas to form at least on the outside air-contacting surfaces of the plastic optical component's body, the nitrogen-containing inorganic compound layer whose composition is represented by $SiOx_0'Ny_0'$ ($y_0' \neq 0$); subsequently, the chamber is completely evacuated to remove $SiH_4$, after which plasma is generated while $O_2$ is allowed to flow, thereby implanting $O^{2-}$ ions into the inorganic compound layer; the $O^{2-}$ ions implanted into the inorganic compound layer diffuse thereinto; thereafter, a mixed gas of, for example, HMDSO ($C_6H_{18}Si_2O$), oxygen and argon (ratio of these components: 1:6:3) is allowed to flow to generate plasma to form the gradient composition coating which is only composed of a silicon oxide on the peripheries of the outside air-contacting surfaces and has a nitrogen-containing composition on the peripheries of the surfaces at which the coating 2 contacts the plastic optical component.

The optical component of the present invention need only have a moisture-proof coating formed at least on the outside air-contacting surfaces of the optical component's body and it is not essential that the moisture-proof coating 2 be formed on all surfaces of the optical component's body 10 as in the case shown in FIG. 1A where the optical component is indicated by 1 and its body by 10.

Figure 2:
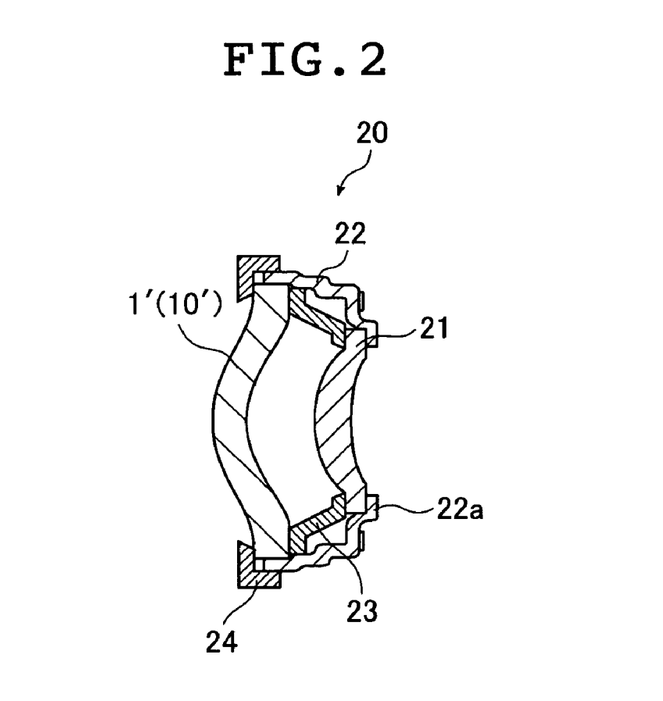
FIG. 2 is a diagrammatic section of an embodiment of an optical unit using the optical component of the invention (as it is cut through a plane including the optical axis)

FIG. 2 is a diagrammatic section of another embodiment of the optical component of the invention (as it is cut through a plane including the optical axis). An optical component in lens form of the invention which is generally indicated by 1' is assembled to make an optical unit 20. The optical unit 20 shown in FIG. 2 is a general optical unit set up for use in a lens mechanism in a silver halide camera or in an imaging module in a digital camera, a video camera or a miniature camera that can be built into a cellular phone. Stated briefly, the optical unit 20 shown in FIG. 2 comprises two lenses 1' and 21 having different Abbe numbers that are assembled into a generally cylindrical lens barrel 22 and fixed in position by means of a lens clamp 24.

In addition, the optical unit 20 shown in FIG. 2 has a spacer 23 interposed between the lenses 1' and 21.

The lens 21 has a high Abbe number, specifically, between about 45 and 60.

Specific examples of the lens having such an Abbe number include lenses made of glass or alicyclic polyolefins typified by ZEONEX™ manufactured by ZEON Corporation. These lens materials are generally known to have a very low saturated water absorbency not higher than 0.01 wt %. The lens 21 is made of such low-hygroscopicity lens material and does not need to have a moisture-proof coating formed on it.

On the other hand, the lens 1' is the optical component 1' of the present invention and a plastic lens that has an Abbe number sufficient to correct chromatic aberration in combination with the lens 21, specifically an Abbe number of from about 23 to about 35, may be used as the optical component's body 10'.

The setup of the optical unit 20 shown in FIG. 2 is described below more specifically. The lens barrel 22 consists of three cylindrical regions that have a common center but different diameters and which are arranged in the order of decreasing diameter along the optical axis of the optical unit 20. The smallest-diameter cylindrical region of the lens barrel 22 has an annular rib portion 22a formed on its end face to protrude inwardly. The inside of the rib portion 22a serves as an aperture through which incident light (e.g. taking light) is launched.

The lens 21 can be assembled into the smallest-diameter region of the lens barrel 22. In other words, the inside diameter of that region is generally equal to but slightly larger than the outside diameter of the lens 21. The optical component 1' of the invention can be assembled into the largest-diameter region of the lens barrel 22. In other words, the inside diameter of that region is generally equal to but slightly larger than the outside diameter of the optical component 1' of the invention.

The lens 21 is assembled into the smallest-diameter region of the lens barrel 22 on the side where the rib portion 22a protrudes (at the aperture through which incident light is launched), and the flange portion of the lens 21 is brought into contact with the rib portion 22a so as to determine the axial position of the lens 21. On the other hand, the optical component 1' of the invention is assembled into the largest-diameter region of the lens barrel 22.

The spacer 23 is a generally cylindrical member having at opposite ends those portions which contact the lens 21 and the optical component 1' of the invention; as already mentioned, the spacer 23 is inserted between the lens 21 and the optical component 1' of the invention within the lens barrel 22. By choosing the axial length of the spacer 23, the relative positions of the lens 21 and the optical component 1' of the invention in the optical axis direction can be determined properly.

In addition, the lens 21 and the optical component 1' of the invention, as well as the lens barrel 22 and the spacer 23 are all molded in such a way that when the lens 21 and the optical component 1' of the invention are properly assembled into the lens barrel 22, their optical axes are in alignment.

To construct the optical unit 20 shown in FIG. 2, the lens 21, the spacer 23 and the optical component 1' of the invention are sequentially assembled into the lens barrel 22 and the optical component 1' of the invention is pressed toward the rib portion 22a by means of the lens clamp 24. The lens clamp 24 working in that way is fixed to the lens barrel 22 with an adhesive or by other means so that the optical unit 20 is fabricated.

Figure 3A:
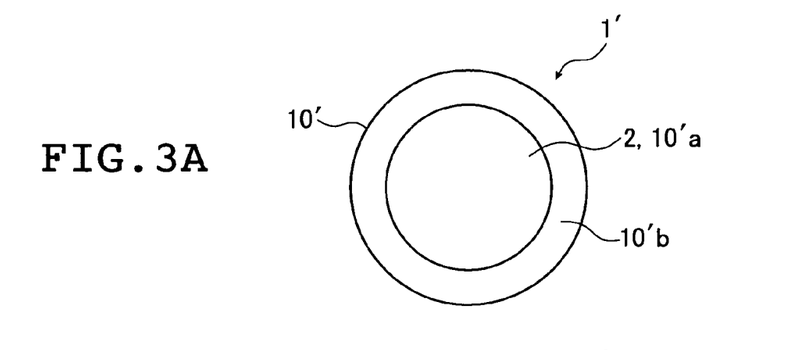
FIG. 3A is a front view for illustrating the shape of the optical component of the present invention shown in FIG. 2 (as it is seen in a direction parallel to the optical axis)
Figure 3B:
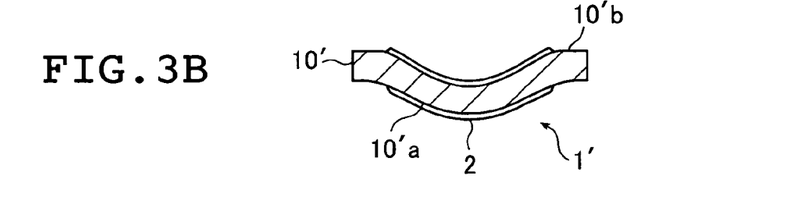
FIG. 3B is a section which is cut in the same direction as FIG. 1B is.

FIG. 3A is a front view of the optical component 1' of the present invention (as it is seen in a direction parallel to the optical axis) and FIG. 3B is a section which is cut in the same direction as FIG. 1B is. Like the optical component's body 10 shown in FIGS. 1A and 1B, the body 10' of the optical component 1' of the present invention shown in FIGS. 3A and 3B includes a lens portion 10'a and a flange portion 10'b.

Further speaking of the optical unit 20 shown in FIG. 2, the optical component 1' of the invention has its flange portion held between the rib portion 22a of the lens barrel 22 and the spacer 23 and the flange portion is prevented from contacting the outside air. Therefore, one may reasonably assume that the moisture absorption and moisture removal through the flange portion is negligible.

Therefore, as shown in FIG. 3B, the optical component 1' of the present invention has the moisture-proof coating 2 formed only on the surfaces of the lens portion 10'a of the optical component's body 10', and the moisture-proof coating 2 is not formed in the flange portion 10'b. Such structure is acceptable, if the resulting optical component has sufficient moisture barrier properties and experiences extremely small changes in resolution and other optical performance even in the case of an environmental change, more specifically a change in the environmental humidity. Due to the difficulty involved in its formation, the moisture-proof coating formed in the flange portion 10'b of the optical component's body 10' may occasionally have poor adhesion. As a result, the moisture-proof coating may readily come off the flange portion 10'b to become a source of contamination during the use of the optical unit 20. Such a problem does not arise in the optical component 1' shown in FIGS. 3A and 3B which has no moisture-proof coating formed in the flange portion 10'b.

Further referring to the optical unit 20 having the setup shown in FIG. 2, if the inside of the lens barrel 22 is held airtight or if the opening in the lens barrel 22 is adapted to be so small that only a small volume of air will flow from the outside into the lens barrel 22, one may reasonably assume that the surface of the lens portion 10'a of the optical component's body 10' of the present invention which faces the interior of the lens barrel 22, namely, the concave face of that lens portion is subjected to very small effects of moisture absorption and moisture removal. In a case like this, the moisture-proof coating 2 need not be formed on that concave face.

On the other hand, depending on the lens forming material used, the high Abbe number lens 21 may be subjected to the effects of moisture absorption and moisture removal. In a case like this, the lens 21 may be formed of the optical component of the present invention.

In order to form the moisture-proof coating only on those outside air-contacting surfaces of the optical component's body 10', namely, in the lens portion 10'a only as in the case of the optical component 1' shown in FIGS. 3A and 3B, the flange portion 10'b may be masked or held in position by a suitable means such as a holder while the moisture-proof coating is being formed.

The optical component of the present invention has the inorganic moisture-proof coating which is excellent in the moisture barrier properties and is formed at least on its outside air-contacting surfaces and hence will not have any uneven profile of water absorbency in the interior of its body and also any uneven profile of refractive index due to the uneven profile of water absorbency even if moisture absorption into or moisture removal from the optical component occurs due to an environmental change, so it is suitable for use as a plastic lens that is assembled to fabricate the optical unit 20 of the type shown in FIG. 2.

The present invention also provides an optical unit in which the above-described optical component of the invention has been assembled as a plastic lens. Stated more specifically, the present invention provides an optical unit comprising at least two lenses having different Abbe numbers, at least one of which is the plastic optical component of the present invention. Therefore, FIG. 2 is also a diagram that shows an embodiment of the optical unit of the present invention.

Note that the optical unit of the present invention is not limited in any particular way as long as it comprises at least two lenses having different Abbe numbers, at least one of them being the optical component of the present invention, and it may have a different setup than the optical unit 20 shown in FIG. 2. For example, in an optical unit for high-resolution applications, a plurality of imaging lenses, say, three or more lenses are used in combination to achieve the desired resolving power and precision. The optical unit of the present invention may comprise such three or more lenses as long as at least one of them is the optical component of the invention.

If the optical unit of the present invention comprises three or more lenses, it is not necessary that all of them have different Abbe numbers. As long as it is optically designed such that at least two of the lenses in the optical unit have different Abbe numbers to correct chromatic aberration overall, two or more lenses having comparable Abbe numbers may be incorporated.

If the optical unit of the invention is to be used in a lens mechanism in a silver halide camera or in an imaging module in a digital camera, a video camera or a miniature camera that can be built into a cellular phone, it preferably has an autofocus mechanism.

The plastic optical component of the present invention will not have an uneven profile of refractive index in its interior even if there occurs moisture absorption or moisture removal in response to an environmental change but the refractive index of the optical component taken as a whole varies gradually in response to the environmental change. Accordingly, an optical unit using this optical component undergoes a change in its optical characteristics in response to the environmental change. However, the change in refractive index is slow and uniform. In the case where the optical component itself which is a plastic lens undergoes a uniform change in refractive index and if the change is very small, not greater than what occurs due to moisture absorption, a substantial effect on the optical performance of the lens is no more than a change in its focal position and can be cancelled by using an autofocus mechanism. Therefore, the optical unit of the present invention, if it is equipped with an autofocus mechanism, has outstanding optical characteristics which will not be affected by environmental changes but can be fully exhibited at all times.

It is known that various principles and control techniques are used by the autofocus mechanism in a lens mechanism in a silver halide camera or in an imaging module in a digital camera, a video camera or a miniature camera that can be built into a cellular phone. While various known autofocus mechanisms may be employed by the optical unit of the invention, a preferred one is such that based on its image picked up through the optical unit, direct check of the subject is made to see whether it is in focus and if it is not, the properly focused condition is obtained by controlling the axial position of the lens or lenses in the optical unit.

Figure 4:
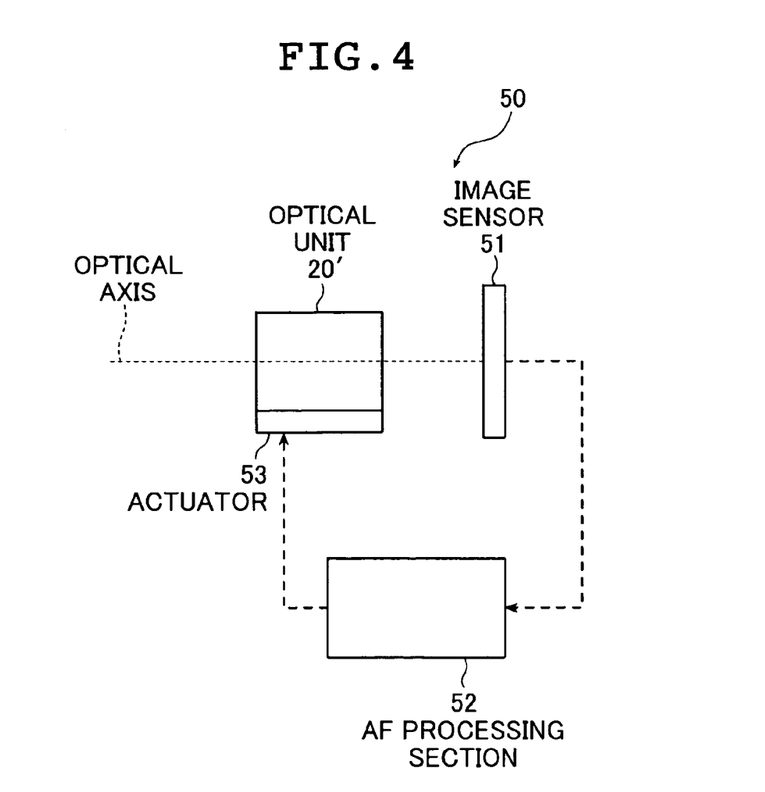
FIG. 4 shows in concept an exemplary layout of an imaging module using the optical unit of the present invention and an autofocus mechanism.

FIG. 4 shows in concept an exemplary layout of an imaging module using the optical unit of the present invention and an autofocus mechanism. It is a simplified view of the setup of a common digital camera. In an imaging module generally indicated by 50 in FIG. 4, the optical unit 20' is the one of the present invention which comprises at least two lenses having different Abbe numbers, one of which is made of the optical component of the invention. The image passing through the optical unit 20' is picked up by a CCD image sensor 51. The optical image information picked up by the image sensor 51 is output as an electric signal and sent to an AF processing section 52. The AF processing section 52, based on the image information sent from the image sensor 51, checks the subject to see whether it is in focus and sends a drive signal to an actuator 53. The actuator 53, based on the drive signal from the AF processing section 52, moves all or some of the lenses in the optical unit 20' back and forth in the optical axis direction until the properly focused position is attained. A variety of means can be used as the actuator 53 and specific examples include a stepping motor, a linear motor, a piezoelectric device and an electroactive polymer (EAP).

While the optical component of the present invention has been described above with the plastic lens for use in optical units being taken as an example, the optical component of the invention is by no means limited to the plastic lens. The optical component's body having the moisture-proof coating formed at least on the outside air-contacting surfaces encompasses a wide range of known structures for plastic optical components. Hence, aside from the illustrated lens, the optical component of the invention may be chosen not only from among lenses having various other shapes and functions but also from among other known optical elements or components including prisms, optical filters, optical screens, deflectors, polarizers, light reflecting members, finders, glasses, contact lenses, reflectors and curved mirrors. For example, an uneven profile of refractive index arising in the interior of a plastic prism due to an environmental change will adversely affect the optical characteristics to cause image distortion or other defect. Therefore, the plastic prism is a preferable application of the optical component of the present invention. Other examples of the optical component's body that may be used in the present invention include known optical elements or components that are used as assembled into imaging optical systems for use in imaging devices such as cameras (e.g., silver halide camera, digital camera and video camera), image forming apparatuses such as copiers and printers, and various other optical equipment including projectors, telescopes, binoculars and magnifiers.

There is also no limitation on the material of the body of the optical component, and a variety of plastic materials (resin materials) used in known optical elements and ordinary optical components may be employed. To mention a few examples, methacrylic resins (e.g., PMMA), acrylic resins including alicyclic ones, polycarbonate resins, polyester resins including aromatic ones, polystyrene resins, acrylonitrile-styrene (AS) resins, alicyclic polyolefins, resins containing the tricyclodecane ring, cycloolefinic polymers, poly(methylpentene), styrene-butadiene copolymers, and polyesters having a fluorene group, may be employed.

The optical component of the present invention is characterized in that it will not have an uneven profile of water absorbency in its interior; considering this feature, among the plastic materials listed in the preceding paragraph, those which have comparatively high water absorbency, specifically a saturated water absorbency in excess of 0.02 wt %, are preferred and specific examples include methacrylic resins, acrylic resins including alicyclic ones, polycarbonate resins, polyester resins including aromatic ones, polystyrene resins, and alicyclic polyolefins. As already mentioned, there are alicyclic polyolefins that have a saturated water absorbency not higher than 0.02 wt % as exemplified by ZEONEX™; on the other hand, there are alicyclic polyolefins having a saturated water absorbency in excess of 0.02 wt %.

If the optical component of the present invention is to be used as the optical component 1' of the optical unit 20 shown in FIG. 2, its body 10' preferably has an Abbe number sufficient to correct chromatic aberration in combination with the lens 21 having high Abbe number, specifically an Abbe number of 45-60; it is specifically preferred that the optical component's body have an Abbe number of from about 23 to about 35. Suitable examples of materials having such Abbe number are polycarbonate resins and aromatic polyester resins.

The method of forming the body of the optical component also is not limited in any particular way and depending on the plastic material to be used, all known plastics molding techniques including injection molding, injection compression molding and compression molding may be adopted.

The shape and size (length, diameter and thickness) of the optical component's body also are not limited in any particular way and may be chosen as appropriate depending on the use of the optical component under consideration.

In the illustrated optical component for instance, the inorganic moisture-proof coating is directly formed at least on the outside air-contacting surfaces of the optical component's body. However, this is not the sole case of the present invention but a coating for adjusting the refractive index, an antireflection coating, a coating for enhancing the adhesion or the like may be formed between the optical component's body and the inorganic moisture-proof coating. Alternatively, an antireflection coating, a coating for adjusting the refractive index, a coating for enhancing the adhesion, a barrier coating for damage prevention or the like may be formed on the inorganic moisture-proof coating. In other words, a layer structure composed of various coatings formed on the body can be used in the plastic optical component of the present invention, as long as the inorganic moisture-proof coating is directly or indirectly formed at least on the outside air-contacting surfaces of the optical component's body.

It is preferable to form an antireflection coating on the outside air-contacting surfaces of the inorganic moisture-proof coating in order to prevent the light transmittance from being reduced due to surface reflection.

The antireflection coating is formed from an inorganic or organic material, and may be of a monolayer or multilayer structure. Further, the antireflection coating may be of a multilayer structure including an inorganic material layer and an organic material layer. The antireflection coating can be formed on one surface or both surfaces of a lens constituting the optical component's body. In the case where the antireflection coating is formed on both the surfaces of the lens, the coating on both the sides may be of an identical structure or of different structures. For example, the antireflection coating may also be composed of a multilayer coating formed on one surface and a simplified monolayer coating formed on the other surface.

Exemplary inorganic materials that may be used include silicon oxides represented by $SiO_x$ ($0<x\leq2$), $ZrO_2$, $TiO_2$, $TiO$, $Ti_2O_3$, $Ti_2O_5$, $Al_2O_3$, $Ta_2O_5$, $CeO_2$, $MgO$, $Y_2O_3$, $SnO_2$, $MgF_2$, and $WO_3$. These may be used singly or in combination of two or more. Of these, silicon oxides represented by $SiO_x$ ($0<x\leq2$), $ZrO_2$, $TiO_2$, $Ti_2O_5$ that are capable of vacuum deposition at low temperatures are preferably used because the lens is made of a plastic.

An example of the multilayer coating formed from the inorganic materials include the one of a lamination structure in which high refractive index material layers and low refractive index material layers are alternately formed, as exemplified by the case where a lens is first coated with a $ZrO_2$ layer, which in turn is coated with a silicon oxide layer represented by SiOx ($0<x\leq2$) so that the total optical thickness of the $ZrO_2$ layer and the silicon oxide layer is $\lambda/4$, the optical thickness of the $ZrO_2$ layer is $\lambda/4$ and the optical thickness of the uppermost silicon oxide layer is $\lambda/4$. The symbol $\lambda$ as used herein refers to the design wavelength, and a wavelength of 520 nm is commonly used. It is preferable to form the uppermost layer from a silicon oxide represented by $SiO_x$ ($0<x\leq2$), because the silicon oxide has a low refractive index and can impart the mechanical strength to the antireflection coating.

Exemplary methods for forming the antireflection coating from the inorganic materials include vacuum deposition, ion plating, sputtering, CVD, and a method in which the inorganic material is deposited by a chemical reaction in a saturated solution.

Examples of the organic material that may be used include FEP (tetrafluoroethylene-hexafluoropropylene copolymer), PTFE (polytetrafluoroethylene) and ETFE (ethylene-tetrafluoroethylene copolymer). The organic material to be used is determined in consideration of the refractive index of the lens material and the refractive index that the hard coating may have. The organic material can be deposited by film deposition methods including vacuum deposition and coating methods suitable for mass production as exemplified by spin coating and dip coating.

EXAMPLES

On the following pages, the plastic optical component of the invention is described in further detail by means of specific examples.

In order to evaluate the optical performance of the plastic optical component of the invention, the optical unit 20 shown in FIG. 2 was employed in Examples. In the optical unit 20 shown in FIG. 2, the lens 21 was a glass lens having an Abbe number of 56 (the radius of the lens portion was 6.4 mm on the entrance face and 4.9 mm on the exit face; average thickness was 2.9 mm); the optical component's body 10' was a lens made of polycarbonate resin having an Abbe number of 30 (the radius of the lens portion 10'$a$ was 9.0 mm on the entrance face and 7.5 mm on the exit face; average thickness was 2.5 mm).

The resolving power of the optical (lens) unit 20 was measured after it was left in a 30% humid environment at 25° C. for one week; the MTF (modulation transfer function) at 50% contrast was 30 lines/mm at the center of the optical axis and 25 lines/mm on the periphery on the average.

Example 1

In Example 1, a plasma CVD process was used to form an inorganic moisture-proof coating 2 whose composition was represented by $SiO_{0.66}N_{0.75}$ (values obtained by the measurement with an Auger electron spectrometer JAMP-10S) and which had a thickness of 150 nm on the entire surface of a lens (optical component's body) 10 made of a polycarbonate resin to thereby obtain an optical component 1 of the present invention as shown in FIG. 1. More specifically, the inorganic moisture-proof coating 2 was formed according to the procedure described below.

The polycarbonate resin lens 10 was dried in vacuo at 50° C. for 48 hours and thereafter set in a chamber of a plasma CVD device. The pressure within the chamber was set to 0.4 MPa and plasma was generated at a high frequency of 13.56 MHz while a mixed gas of $SiH_4$ and $N_4$ (5:95) was allowed to flow as the starting material gas, thereby forming on the entire surface of the lens 10, the inorganic moisture-proof coating 2 whose composition was represented by $SiO_{0.66}N_{0.75}$ (values obtained by the measurement with the Auger electron spectrometer JAMP-10S) and which had a thickness of 150 nm. When the inorganic moisture-proof coating 2 was formed, the lens 10 was kept at a temperature of 60° C. (±2° C.)

<Measurement of Light Transmittance>

The total light transmittance of the optical component 1 of the invention having been obtained by the above procedure was measured with a hazemeter HZ-1 available from Suga Test Instruments Co., Ltd. As a result, the light transmittance was 85%.

<Measurement of Resolving Power>

The optical component 1 of the invention having been obtained by the above procedure was thoroughly dried in a desiccator at 50° C. for 7 days and was thereafter assembled as an optical component 1' to make an optical unit 20 shown in FIG. 2. Similarly, a glass lens (having an Abbe number of 56) was assembled as a lens 21 to make the optical unit 20. Subsequently, the individual lenses were finely adjusted in both orientation and lens-to-lens distance to have specified values of resolving power. The optical unit 20 was then left to stand in a 30% humid environment at 25° C. for a week and thereafter placed under conditions of 90% RH and 25° C. to measure time-dependent changes in the resolving power.

Using an MTF meter of TRIOPTICS GmbH, resolving power was measured as MTF at 50% contrast. The peripheral resolving power was expressed by MTF as averaged for tangential and sagittal directions. The results of the resolving power measurements are shown in Table 1.

Example 2

The procedure of Example 1 was repeated to form on the surface of the lens 10, an inorganic compound layer whose composition was represented by $SiO_{0.66}N_{0.75}$ (values obtained by the measurement with the Auger electron spectrometer JAMP-10S) and which had a thickness of 120 nm. Subsequently, the chamber was completely evacuated to remove $SiH_4$, after which plasma was generated at a high frequency of 13.56 MHz while $O_2$ was allowed to flow in the chamber, thereby implanting oxygen atoms into the $SiO_{0.66}N_{0.75}$ layer. Thereafter, a mixed gas of HMDSO ($C_6H_{18}Si_2O$), oxygen and argon (ratio of these components: 1:6:3) was allowed to flow to generate plasma, whereby a gradient composition coating which was only composed of a silicon oxide on the peripheries of the outside air-contacting surfaces and had the composition represented by $SiO_{0.66}N_{0.75}$ on the peripheries of the contact surfaces with the lens 10 was formed to obtain the optical component 1 of the present invention. During the formation of the gradient composition coating, the lens 10 was kept at a temperature of 60° C. (±2° C.). The light transmittance of the resulting optical component 1 was measured as in Example 1. As a result, the light transmittance was 88%. The resolving power was also measured as in Example 1. The results are shown in Table 1.

Comparative Example 1

In Comparative Example 1, the inorganic moisture-proof coating 2 was not formed on the polycarbonate resin lens 10.

The optical component obtained in Comparative Example 1 was subjected to the measurement of the light transmittance and resolving power as in Example 1. The light transmittance in Comparative Example 1 was 90%.

The results of the measurement of the resolving power are shown in Table 1.

Comparative Example 2

The inorganic moisture-proof coating 2 whose composition was the same as that in Example 1 and which had a thickness of 150 nm was formed under the same conditions as in Example 1 by using a plasma CVD device of a capacitively coupled plasma excitation type in which a member to be coated was disposed in close proximity to a lower electrode. During the formation of the inorganic moisture-proof coating 2, an increase of the temperature of the lens 10 up to 100° C. was confirmed.

The optical component obtained in Comparative Example 2 was subjected to the measurement of the light transmittance and resolving power as in Example 1. The light transmittance in Comparative Example 2 was 85%.

The results of the measurement of the resolving power are shown in Table 1.

TABLE 1

|  |  | Humidifying time (hr) | | | |
| --- | --- | --- | --- | --- | --- |
|  |  | 0 | 12 | 24 | 36 |
| Example 1 | Center | 30 | 30 | 30 | 30 |
|  | Peripheral | 25 | 25 | 25 | 25 |
| Example 2 | Center | 30 | 30 | 30 | 30 |
|  | Peripheral | 25 | 25 | 25 | 25 |
| Comparative Example 1 | Center | 30 | 25 | 29 | 30 |
|  | Peripheral | 25 | 21 | 23 | 25 |
| Comparative Example 2 | Center | 27 | 27 | 27 | 27 |
|  | Peripheral | 22 | 22 | 22 | 22 |

As is clear from Table 1, the optical units of Examples 1 and 2 suffered only minimal changes, or drops, in both the central and peripheral resolving powers with the lapse of time from the start of resolving power measurement.

On the other hand, the central and peripheral resolving powers of the optical unit of Comparative Example 1 returned to the initial levels 5 days after the start of resolving power measurement; however, after 1 and 2 days of the measurement, both the central and peripheral resolving powers of the optical unit experienced noticeable drops. A drop of the resolving power presumably caused by thermal degradation of the lens was confirmed in Comparative Example 2 in which the temperature of the polycarbonate resin lens increased up to 100° C. during the formation of the inorganic moisture-proof coating 2.

The results of the light transmittance measurement showed that the light transmittance was less reduced due to surface reflection in the optical component in Example 2 in which the peripheries of the outside air-contacting surfaces of the moisture-proof coating were only composed of a silicon oxide than in the optical component in Example 1.

What is claimed is:

1. A plastic optical component comprising:
    an optical component's body; and
    an inorganic moisture-proof coating which is directly or indirectly formed by a plasma CVD process at least on surfaces of the optical component's body that contact outside air,
    wherein the plastic optical component is kept at a temperature of 80° C. or lower when the inorganic moisture-proof coating is formed by the plasma CVD process, and
    wherein the inorganic moisture-proof coating is of a structure in which two or more inorganic compound layers whose compositions are different from each other and are represented by $SiOx_0Ny_0$ where $0 \leq x_0 \leq 2$, $0 \leq y_0 \leq 1.33$ and $2x_0 + 3y_0 \leq 4$ provided that $y_0 = 0$ in an outermost layer of the two or more inorganic compound layers that contacts the outside air and $y_0 \neq 0$ in its innermost layer that contacts the plastic optical component, are laminated onto the optical component's body.

2. The plastic optical component according to claim 1, wherein the plasma CVD process is of an inductively coupled plasma excitation type.

3. The plastic optical component according to claim 1, wherein the inorganic moisture-proof coating is of a structure in which two or more inorganic compound layers whose compositions are different from each other and are represented by $SiOx_0Ny_0$ where $0 \leq x_0 \leq 2$, $0 \leq y_0 \leq 1.33$ and $2x_0 + 3y_0 \leq 4$ provided that $y_0 = 0$ in an outermost layer of the two or more inorganic compound layers that contacts the outside air and $y_0 \neq 0$ in its innermost layer that contacts the plastic optical component, are laminated onto the optical component's body, wherein the two or more inorganic compound layers have a total thickness of 10 to 200 nm and wherein the outermost layer of the two or more inorganic compound layers that contacts the outside air has a thickness of 10 to 100 nm.

4. The plastic optical component according to claim 1, wherein the inorganic moisture-proof coating is of a structure in which two or more inorganic compound layers whose compositions are different from each other are laminated onto the optical component's body and wherein an innermost layer of the two or more inorganic compound layers that contacts the plastic optical component has a composition represented by $SiOx_1Ny_1$ where $0.3 \leq x_1 \leq 1.4$, $0.4 \leq y_1 \leq 0.9$ and $2x_1+3y_1 \leq 4$, and the two or more inorganic compound layers except the innermost layer each have a composition represented by $SiOx_0Ny_0$ where $0 \leq x_0 \leq 2$, $0y_0 \leq 1.33$ and $2x_0+3y_0 \leq 4$ provided that $y_0=0$ in its outermost layer that contacts the outside air.

5. The plastic optical component according to claim 1, wherein the inorganic moisture-proof coating has a composition represented by $SiOx_0'Ny_0'$ where $0 \leq x_0' \leq 2$, $0y_0' \leq 1.33$ and $2x_0'+3y_0' \leq 4$ provided that $y_0'=0$ in proximity to outside air-contacting surfaces and $y_0' \neq 0$ in proximity to surfaces at which the inorganic moisture-proof coating contacts the plastic optical component, and wherein the inorganic moisture-proof coating is a gradient composition coating whose composition continuously changes along a thickness direction of the inorganic moisture-proof coating.

6. The plastic optical component according to claim 1, wherein the inorganic moisture-proof coating has a composition represented by $SiOx_0'Ny_0'$ where $0 \leq x_0' \leq 2$, $0 \leq y_0' \leq 1.33$ and $2x_0'+3y_0' \leq 4$ provided that $y_0'=0$ in proximity to outside air-contacting surfaces and $y_0' \neq 0$ in proximity to surfaces at which the inorganic moisture-proof coating contacts the plastic optical component, and wherein the inorganic moisture-proof coating is a gradient composition coating whose composition continuously changes along a thickness direction of the inorganic moisture-proof coating, and has a thickness of 10 to 200 nm and in a portion satisfying $y_0'=0$, a thickness of 10 to 100 nm.

7. The plastic optical component according to claim 1, wherein a material constituting the plastic optical component has a saturated water absorbency in excess of 0.01 wt %.

8. A method of forming an inorganic moisture-proof coating on the plastic optical component according to claim 7, wherein the plasma CVD process is of an inductively coupled plasma excitation type.

9. The plastic optical component according to claim 1, wherein the plastic optical component is a lens.

10. The plastic optical component according to claim 1, wherein the plastic optical component is a prism.

11. An optical unit comprising at least two lenses having different Abbe numbers, wherein at least one of the lenses is the plastic optical component according to claim 1.

12. An optical unit comprising at least two lenses having different Abbe numbers, wherein at least one of the lenses is the plastic optical component according to claim 1 and the optical unit has an autofocus mechanism.

13. An optical unit comprising a lens having an Abbe number of 45-60 and a lens having an Abbe number of 23-35, wherein the lens having an Abbe number of 23-35 is the plastic optical component according to claim 1.

14. An optical unit comprising a lens having an Abbe number of 45-60 and a lens having an Abbe number of 23-35, wherein the lens having an Abbe number of 45-60 is made of glass or alicyclic polyolefins, the lens having an Abbe number of 23-35 is the plastic optical component according to claim 1 and the plastic optical component is made of at least one plastic material selected from the group consisting of methacrylic resins, acrylic resins including alicyclic ones, polycarbonate resins, polyester resins including aromatic ones, polystyrene resins, acrylonitrile-styrene resins, alicyclic polyolefins, resins containing the tricyclodecane ring, cycloolefinic polymers, poly(methylpentene), styrene-butadiene copolymers, and polyesters having a fluorene group.

15. A plastic optical component comprising:
an optical component's body; and
an inorganic moisture-proof coating which is directly or indirectly formed by a plasma CVD process at least on surfaces of the optical component's body that contact outside air,
wherein the plastic optical component is kept at a temperature of 80° C. or lower when the inorganic moisture-proof coating is formed by the plasma CVD process, and
wherein the inorganic moisture-proof coating is of a structure in which two or more inorganic compound layers whose compositions are different from each other and are represented by $SiOx_0Ny_0$ where $0 \leq x_0 \leq 2$, $0 \leq y_0 \leq 1.33$ and $2x_0+3y_0 \leq 4$ provided that $y_0=0$ in an outermost layer of the two or more inorganic compound layers that contacts the outside air and $y_0 \neq 0$ in its innermost layer that contacts the plastic optical component, are laminated onto the optical component's body, wherein the two or more inorganic compound layers have a total thickness of 10 to 200 nm and wherein the outermost layer of the two or more inorganic compound layers that contacts the outside air has a thickness of 10 to 100 nm.

16. A plastic optical component comprising:
an optical component's body; and
an inorganic moisture-proof coating which is directly or indirectly formed by a plasma CVD process at least on surfaces of the optical component's body that contact outside air,
wherein the plastic optical component is kept at a temperature of 80° C. or lower when the inorganic moisture-proof coating is formed by the plasma CVD process, and
wherein the inorganic moisture-proof coating is of a structure in which two or more inorganic compound layers whose compositions are different from each other are laminated onto the optical component's body and wherein an innermost layer of the two or more inorganic compound layers that contacts the plastic optical component has a composition represented by $SiOx_1Ny_1$ where $0.3 \leq x_1 \leq 1.4$, $0.4 \leq y_1 \leq 0.9$ and $2x_1+3y_1 \leq 4$, and the two or more inorganic compound layers except the innermost layer each have a composition represented by $SiOx_0Ny_0$ where $0 \leq x_0 \leq 2$, $0 \leq y_0 \leq 1.33$ and $2x_0+3y_0 \leq 4$ provided that $y_0=0$ in its outermost layer that contacts the outside air.

17. A plastic optical component comprising:
an optical component's body; and
an inorganic moisture-proof coating which is directly or indirectly formed by a plasma CVD process at least on surfaces of the optical component's body that contact outside air,
wherein the plastic optical component is kept at a temperature of 80° C. or lower when the inorganic moisture-proof coating is formed by the plasma CVD process, and
wherein the inorganic moisture-proof coating has a composition represented by $SiOx_0'Ny_0'$ where $0 \leq x_0' \leq 2$, $0y_0'1.33$ and $2x_0'+3y_0' \leq 4$ provided that $y_0'=0$ in proximity to outside air-contacting surfaces and $y_0' \neq 0$ in proximity to surfaces at which the inorganic moisture-proof coating contacts the plastic optical component, and wherein the inorganic moisture-proof coating is a gradient composition coating whose composition continuously changes along a thickness direction of the inorganic moisture-proof coating.

18. A plastic optical component comprising:

an optical component's body; and an inorganic moisture-proof coating which is directly or indirectly formed by a plasma CVD process at least on surfaces of the optical component's body that contact outside air, wherein the plastic optical component is kept at a temperature of 80° C. or lower when the inorganic moisture-proof coating is formed by the plasma CVD process, and wherein the inorganic moisture-proof coating has a composition represented by $SiO_{x_0'}N_{y_0'}$ where $0 \leq x_0' \leq 2$, $0 \leq y_0' \leq 1.33$ and $2x_0'+3y_0' \leq 4$ provided that $y_0'=0$ in proximity to outside air-contacting surfaces and $y_0' \neq 0$ in proximity to surfaces at which the inorganic moisture-proof coating contacts the plastic optical component, and wherein the inorganic moisture-proof coating is a gradient composition coating whose composition continuously changes along a thickness direction of the inorganic moisture-proof coating, and has a thickness of 10 to 200 nm and in a portion satisfying $y_0'=0$, a thickness of 10 to 100 nm.

\* \* \* \* \*